(12) United States Patent
Haruna

(10) Patent No.: US 11,575,188 B2
(45) Date of Patent: Feb. 7, 2023

(54) PHASE SHIFTER

(71) Applicant: Mitsubishi Electric Corporation, Tokyo (JP)

(72) Inventor: Takao Haruna, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/422,445

(22) PCT Filed: May 7, 2019

(86) PCT No.: PCT/JP2019/018296
§ 371 (c)(1),
(2) Date: Jul. 12, 2021

(87) PCT Pub. No.: WO2020/225857
PCT Pub. Date: Nov. 12, 2020

(65) Prior Publication Data
US 2022/0077552 A1 Mar. 10, 2022

(51) Int. Cl.
*H01P 1/185* (2006.01)
*H03H 7/20* (2006.01)
*H03H 11/20* (2006.01)

(52) U.S. Cl.
CPC .............. *H01P 1/185* (2013.01); *H03H 7/20* (2013.01); *H03H 11/20* (2013.01)

(58) Field of Classification Search
None
See application file for complete search history.

(56) References Cited

U.S. PATENT DOCUMENTS 5,519,349 A * 5/1996 Nakahara ............... H03H 11/20
327/554
6,252,474 B1 6/2001 Mizutani
(Continued)

FOREIGN PATENT DOCUMENTS

| JP | H11-195960 A | 7/1999 |
| JP | 2011-259215 A | 12/2011 |
| WO | 2015186578 A1 | 12/2015 |

OTHER PUBLICATIONS

An Office Action mailed by China National Intellectual Property Administration dated Feb. 9, 2022, which corresponds to Chinese Patent Application No. 201980095841.6 and is related to U.S. Appl. No. 17/422,445; with English language translation.
(Continued)

*Primary Examiner* — Cassandra F Cox
(74) *Attorney, Agent, or Firm* — Studebaker & Brackett PC

(57) ABSTRACT

First and second paths (I,II) are connected in parallel between an input terminal (IN) and an output terminal (OUT). A high-pass filter (HPF) is provided in the first path (I). A low-pass filter (LPF) is provided in the second path (II). A switch (SW1-SW4) connects one of the high-pass filter (HPF) and the low-pass filter (LPF) to the input terminal (IN) and the output terminal (OUT) and disconnects the other. A transmission line (TL1,TL2) is provided on the first and second paths (I,II) respectively. A line length of the transmission line (TL1,TL2) is adjusted such that a resonance caused due to circuit constants of the high-pass filter (HPF) and the low-pass filter (LPF) and capacitance obtained when the switch (SW1-SW4) is OFF is shifted to a communication frequency band.

7 Claims, 6 Drawing Sheets

(56) References Cited

U.S. PATENT DOCUMENTS

| | | |
|---|---|---|
| 7,724,107 B2 * | 5/2010 | Miya .................. H03H 7/20 333/156 |
| 10,763,827 B1 * | 9/2020 | Christange ............ H03H 7/345 |
| 10,770,770 B2 * | 9/2020 | Sharma ................. H03H 11/22 |
| 2006/0001507 A1 | 1/2006 | Nakamura |
| 2011/0304409 A1 | 12/2011 | Tamura |
| 2017/0085242 A1 | 3/2017 | Horita |
| 2019/0020088 A1 | 1/2019 | Huettner et al. |

OTHER PUBLICATIONS

International Search Report; Written Opinion; and Notification of Transmittal of the International Search Report and the Written Opinion of the International Searching Authority, or the Declaration issued in PCT/JP2019/018296; dated Jun. 11, 2019.

An Office Action mailed by China National Intellectual Property Administration dated Jul. 11, 2022, which corresponds to Chinese Patent Application No. 201980095841.6 and is related to U.S. Appl. No. 17/422,445; with English language translation.

\* cited by examiner

PHASE SHIFTER

FIELD

The present disclosure relates to a phase shifter.

BACKGROUND

A high-frequency phase shifter is used for communication devices using a microwave band and a millimeter wave band, for example, in a range from several GHz to several hundreds of GHz, for mobile communication, satellite communication, and the like (e.g., see PTL 1). Such a phase shifter is produced using an MMIC or the like.

CITATION LIST

Patent Literature

[PTL n] JP H11-195960 A

SUMMARY

Technical Problem

In a conventional high-pass/low-pass switch-type phase shifter, a frequency band at which a desired phase amount is obtained is narrow due to frequency characteristics of a high-pass filter and a low-pass filter, and thus it is difficult to broaden the band of the phase shifter.

The present invention has been made to solve the above-described problem, and an object of the present invention is to obtain a phase shifter in which a frequency band at which a desired phase amount is obtained can be broadened.

Solution to Problem

A phase shifter according to the present disclosure includes: an input terminal; an output terminal; first and second paths connected in parallel between the input terminal and the output terminal; a high-pass filter provided in the first path; a low-pass filter provided in the second path; a switch connecting one of the high-pass filter and the low-pass filter to the input terminal and the output terminal and disconnecting the other of the high-pass filter and the low-pass filter; and a transmission line provided on the first and second paths respectively, wherein a line length of the transmission line is adjusted such that a resonance caused due to circuit constants of the high-pass filter and the low-pass filter and capacitance obtained when the switch is OFF is shifted to a communication frequency band.

Advantageous Effects of Invention

In the present disclosure, the line length of the transmission line is adjusted such that the resonance caused due to the circuit constants of the high-pass filter and the low-pass filter and the capacitance obtained when the switch is OFF is shifted to the communication frequency band. Accordingly, the frequency band at which a desired phase amount in the phase shifter can be increased.

DESCRIPTION OF EMBODIMENTS

Figure 1:
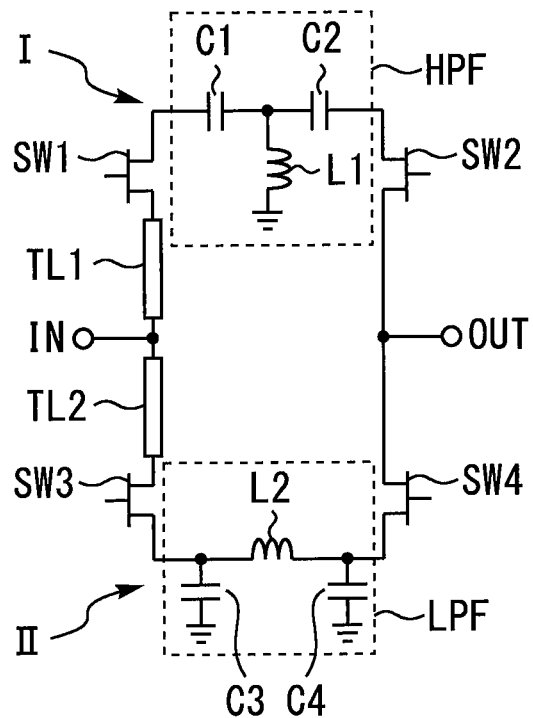
FIG. 1 is a diagram illustrating a phase shifter according to Embodiment 1.

A phase shifter according to an embodiment will be described with reference to the drawings. The same or corresponding components are denoted by the same reference numerals, and repeated descriptions may be omitted.

Embodiment 1

FIG. 1 is a diagram illustrating a phase shifter according to Embodiment 1. This phase shifter is a 180-degree high-pass/low-pass switch-type phase shifter.

A first path I and a second path II are connected in parallel between an input terminal IN and an output terminal OUT. The first path I is provided with a high-pass filter HPF. The second path II is provided with a low-pass filter LPF.

A switch SW1 is connected between the input terminal IN and the high-pass filter HPF. A switch SW2 is connected between the high-pass filter HPF and the output terminal OUT. A switch SW3 is connected between the input terminal IN and the low-pass filter LPF. A switch SW4 is a connected between the low-pass filter LPF and the output terminal OUT. The switches SW1 to SW4 connect one of the high-pass filter HPF and the low-pass filter LPF to the input terminal IN and the output terminal OUT, and disconnect the other of the high-pass filter HPF and the low-pass filter LPF.

The high-pass filter HPF includes capacitors C1 and C2 connected in series between the switches SW1 and SW2, and an inductor L1 connected between a node between the capacitors C1 and C2 and a ground point. The low-pass filter LPF includes an inductor L2 connected in series between the switches SW3 and SW4, and capacitors C3 and C4 connected between both ends of the inductor L2 and the ground point.

Transmission lines TL1 and TL2 are provided on the first and second paths I and II, respectively. Note that the transmission lines TL1 and TL2 are provided on a side where the switches SW1 and SW3 are provided in this case, but instead may be provided on a side where the switches SW2 and SW4 are provided. The line length of each of the transmission lines TL1 and TL2 is adjusted such that resonance caused due to circuit constants of the high-pass filter HPF and the low-pass filter LPF and capacitances obtained when the switches SW1 to SW4 are OFF is shifted to a communication frequency band.

Next, an operation of the phase shifter according to the present embodiment will be described. When the switches SW1 and SW2 are turned on and the switches SW3 and SW4 are turned off, a communication frequency signal input to the input terminal IN passes through the high-pass filter HPF and is output from the output terminal OUT. At this time, the passing phase advances. On the other hand, when the switches SW1 and SW2 are turned off and the switches SW3 and SW4 are turned on, the signal passes through the low-pass filter LPF and the passing phase is delayed. By switching the four switches SW1 to SW4 in this manner, the signal path is switched to the high-pass filter HPF or the low-pass filter LPF, thereby creating two phase amounts and obtaining one phase amount based on the difference between the two phase amounts.

Figure 2:
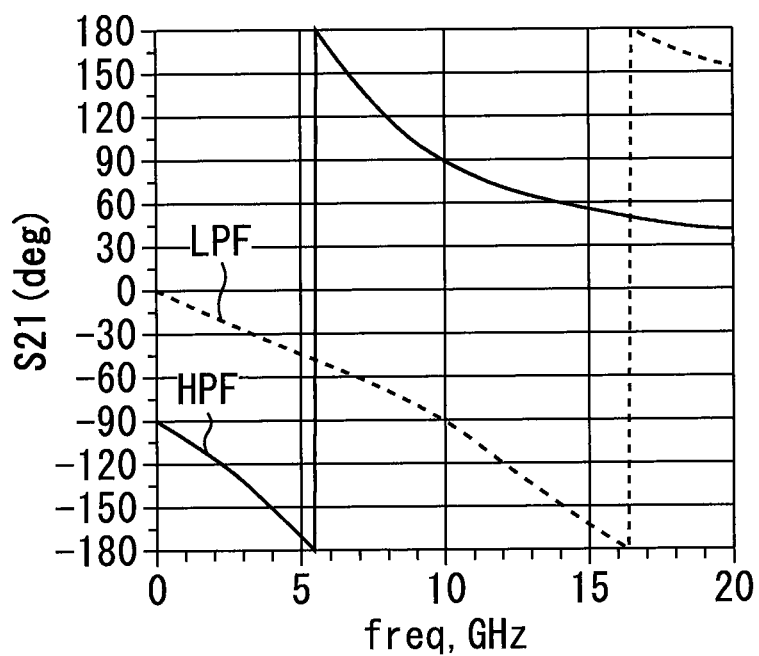
FIG. 2 is a graph illustrating phase characteristics of an S-parameter S21 of a phase shifter according to the comparative example.
Figure 3:
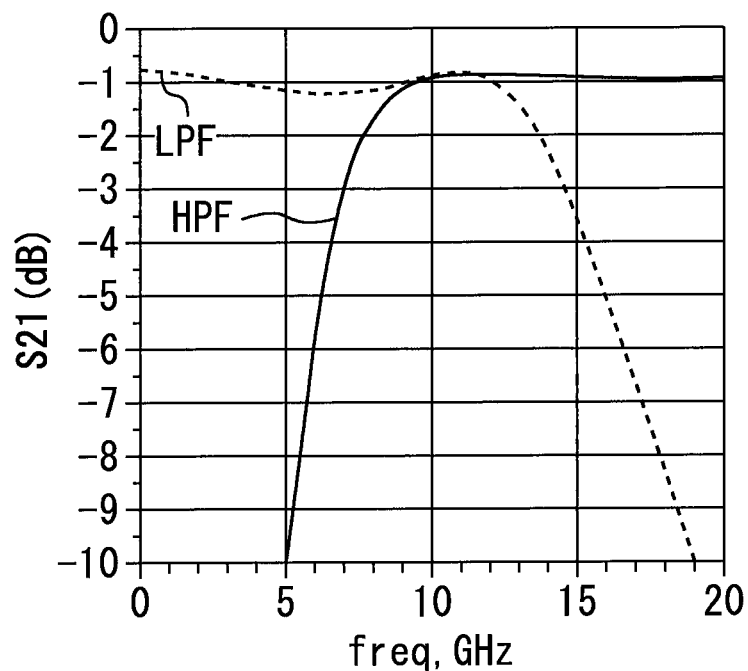
FIG. 3 is a graph illustrating amplitude characteristics of the S-parameter S21 of the phase shifter according to the comparative example.
Figure 4:
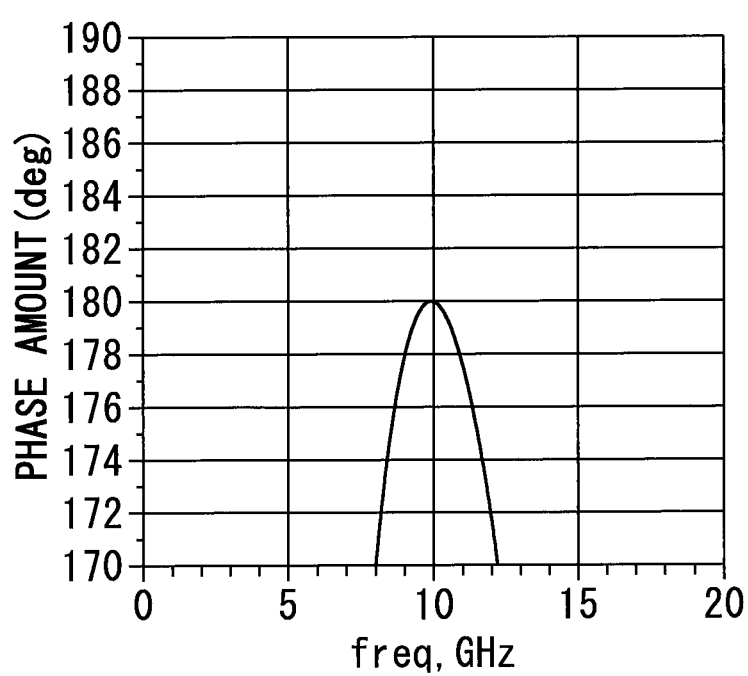
FIG. 4 is a graph illustrating the phase amount of the phase shifter according to the comparative example.

Next, comparison of advantageous effects of the present embodiment with a comparative example will be described. In the comparative example, the transmission lines TL1 and TL2 are not present. FIG. 2 is a graph illustrating phase characteristics of an S-parameter S21 of a phase shifter according to the comparative example. Herein assume that capacitance values obtained when the switches SW1 to SW4 are OFF are zero. This phase shifter is a phase shifter that obtains a phase amount of 180 degrees at a communication frequency of 10 GHz. The high-pass filter starts at a phase of −90 degrees, and the low-pass filter starts at a phase of 0 degrees. FIG. 3 is a graph illustrating amplitude characteristics of the S-parameter S21 of the phase shifter according to the comparative example. Passing characteristics that are characteristics of the high-pass filter and the low-pass filter are shown. FIG. 4 is a graph illustrating the phase amount of the phase shifter according to the comparative example. The phase amount is a phase difference between the high-pass filter HPF and the low-pass filter LPF. It can be seen that the phase difference is 180 degrees only in the vicinity of the frequency of 10 GHz.

Figure 5:
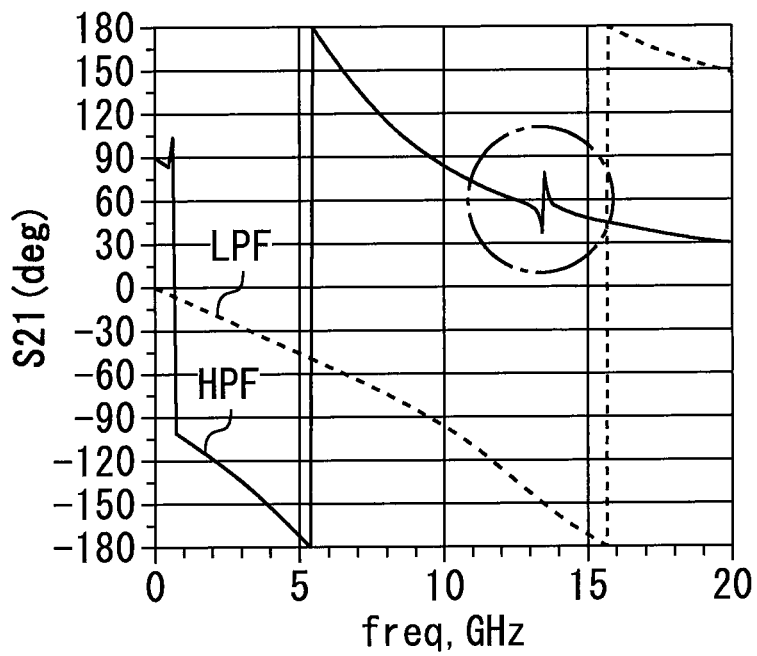
FIG. 5 is a graph illustrating amplitude characteristics of the S-parameter S21 when Coff is present.

The switches SW1 to SW4 are transistors, diodes, or the like, which are not ideally open in the OFF state, and have a small amount of capacitance Coff. Coff is dependent on the size, the gate length, or the like of each transistor. The small amount of capacitance Coff prevents the paths of the high-pass filter and the low-pass filter from being ideally separated, and the paths slightly interfere with each other. FIG. 5 is a graph illustrating amplitude characteristics of the S-parameter S21 when Coff is present. One path interferes with the other path via Coff, so that resonance occurs in the phase characteristics of the S-parameter S21. The resonance occurs in the vicinity of 13.5 GHz (a portion surrounded by a dashed-dotted line in FIG. 5). The frequency and magnitude of the resonance vary depending on the circuit constants of the high-pass filter HPF and the low-pass filter LPF and the magnitude of Coff of each transistor.

Accordingly, in the present embodiment, the length of each of the transmission lines TL1 and TL2 is set such that the resonance is shifted to the communication frequency band. For example, the frequency at which the resonance occurs decreases as the capacitance value of Coff increases. Therefore, the resonance may be shifted to the communication frequency band by setting the length of each of the transmission lines TL1 and TL2 to be shorter. Further, the frequency at which the resonance occurs decreases as the circuit constant of the high-pass filter HPF or the low-pass filter LPF increases. Therefore, the resonance may be shifted to the communication frequency band by setting the length of each of the transmission lines TL1 and TL2 to be shorter.

Figure 6:
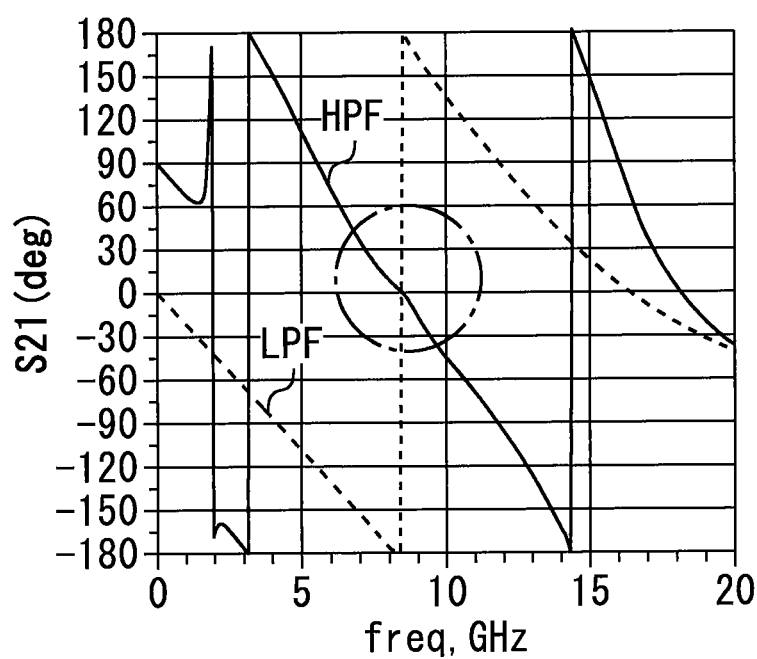
FIG. 6 is a graph illustrating amplitude characteristics of the S-parameter S21 of the phase shifter according to Embodiment 1.

FIG. 6 is a graph illustrating amplitude characteristics of the S-parameter S21 of the phase shifter according to Embodiment 1. The transmission lines TL1 and TL2 are provided to thereby shift the resonance to the communication frequency band while a steep phase change of the resonance becomes gentler. Specifically, the resonance occurring in the vicinity of 13.5 GHz in FIG. 5 is moved to the vicinity of 8.3 GHz in FIG. 6 (a portion surrounded by a dashed-dotted line in FIG. 6), and the amplitude is decreased.

Figure 7:
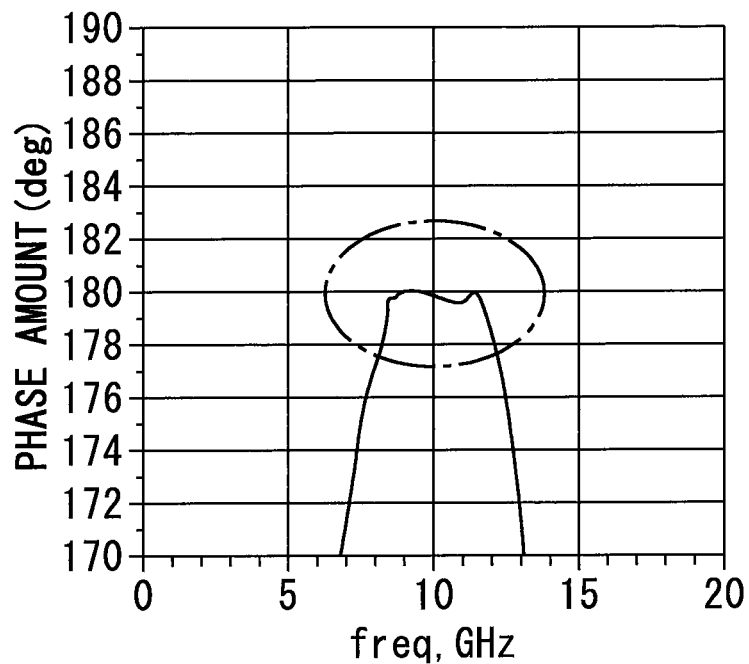
FIG. 7 is a graph illustrating the phase amount of the phase shifter according to Embodiment 1.
Figure 8:
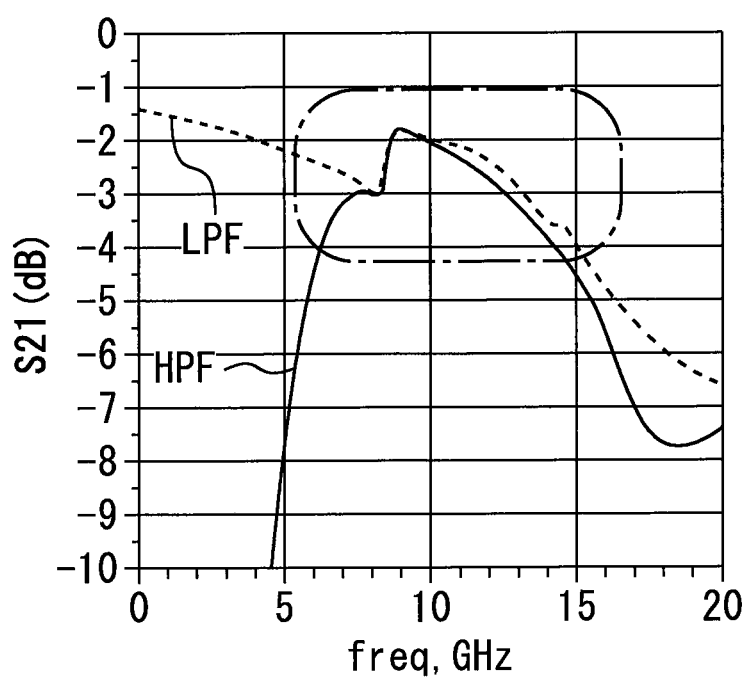
FIG. 8 is a graph illustrating amplitude characteristics of the S-parameter S21 of the phase shifter according to Embodiment 1.

FIG. 7 is a graph illustrating the phase amount of the phase shifter according to Embodiment 1. FIG. 8 is a graph illustrating amplitude characteristics of the S-parameter S21 of the phase shifter according to Embodiment 1. Since the resonance is used, an extreme value and an inflection point (ripple) are generated in the phase and amplitude of the S-parameter S21.

As described above, in the present embodiment, the line length of each of the transmission lines TL1 and TL2 is adjusted such that the resonance caused due to the circuit constants of the high-pass filter HPF and the low-pass filter LPF and the capacitance Coff obtained when the switches SW1 to SW4 are OFF is shifted to the communication frequency band. Thus, as illustrated in FIG. 7, an area in which the phase difference is 180 degrees in Embodiment 1 is wider than that in FIG. 4 according to the comparative example. Accordingly, the frequency band at which a desired phase amount in the phase shifter can be increased. An increase in the frequency band can be achieved only by inserting a simple circuit, such as a transmission line, and thus a small phase shifter with a wide frequency band can be obtained. For example, when the center frequency of the communication frequency is 10 GHz, a frequency band of about 8 to 12 GHz can be covered as the frequency band at which a desired phase amount can be obtained. Further, the frequency range in each band in the IEEE categories of microwave frequencies (L-band, Ka-band, etc.).

Note that the circuit constants of the high-pass filter HPF and the low-pass filter LPF are substantially uniquely determined by the communication frequency. Coff per unit gate width of the switches SW1 to SW4 is also dependent on the manufacturing process of the switches SW1 to SW4 and the like, and Coff is about 0.1 to 0.5 pF/mm. Accordingly, it is expected that the line length of each of the transmission lines TL1 and TL2 for shifting the resonance to the communication frequency band is about ¼ of the wavelength of the communication frequency.

Embodiment 2

Figure 9:
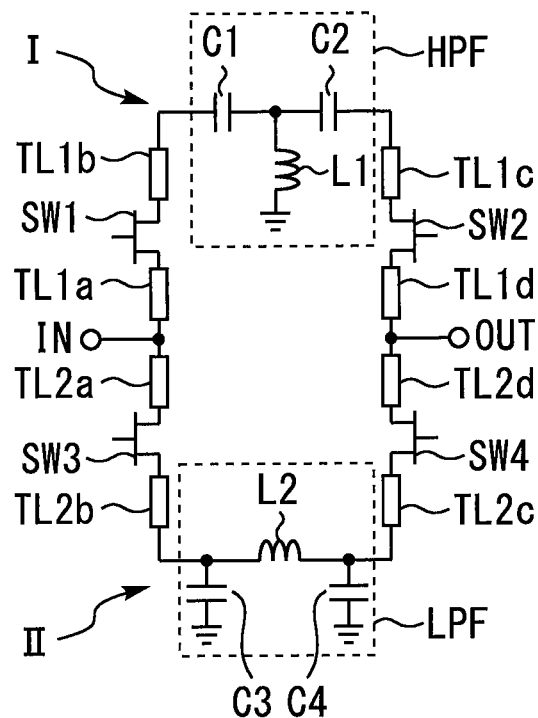
FIG. 9 is a diagram illustrating a phase shifter according to Embodiment 2.

FIG. 9 is a diagram illustrating a phase shifter according to Embodiment 2. The transmission line T11 includes a plurality of lines TL1a to T1d. The transmission line T12 includes a plurality of lines TL2a to T2d. The plurality of lines TL1a to T1d, and TL2a to T2d are arranged on the first and second paths I and II in a dispersed manner. The area in which the transmission lines are arranged as described above is not particularly limited. However, the total of the line lengths of the plurality of lines TL1a to T1d and the total of the line lengths of the plurality of lines TL2a to T2d need to be adjusted so as to shift the resonance to the communication frequency band.

The passing phase in the high-pass filter HPF is +90° and the passing phase in the low-pass filter LPF is −90°. The phase amount formed by the both filters is 180°. Since the phase amount is determined as described above, the dispersed transmission lines TL1a to T1d and TL2a to T2d are not arranged in the circuits of the high-pass filter HPF and the low-pass filter LPF.

It is expected that the total of the line lengths of the plurality of lines TL1a to T1d and the total of the line lengths of the plurality of lines TL2a to T2d for shifting the resonance to the communication frequency band are about ¼ of the wavelength of the communication frequency.

In the present embodiment, the transmission lines can be arranged in a dispersed manner in a gap between the switches SW1 to SW4 and the high-pass filter HPF and the low-pass filter LPF. Therefore, the layout can be efficiently designed, thereby achieving a reduction in the size of the phase shifter, as well as the advantageous effects of Embodiment 1.

Embodiment 3

Figure 10:
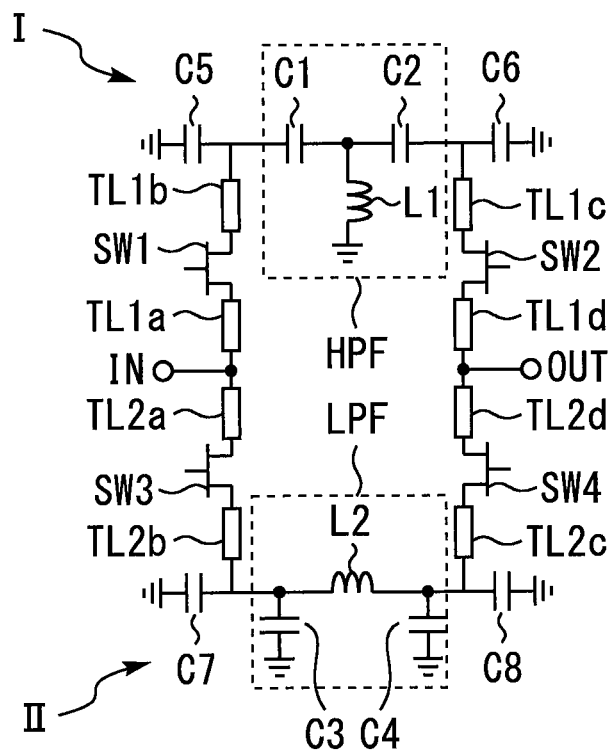
FIG. 10 is a diagram illustrating a phase shifter according to Embodiment 3.

FIG. 10 is a diagram illustrating a phase shifter according to Embodiment 3. Capacitors C5 and C6 are shunt-connected to the first path I according to Embodiment 2 and capacitors C7 and C8 are shunt-connected to the second path II. Not only the capacitor C5 to C8, but also circuits of any type and shape, such as inductors, capacitors, and circuits formed in combination with the inductors and capacitors and transmission lines, can be used, as long as the circuits each function as a phase change circuit that changes the passing phase. This phase change circuit and the transmission lines TL1 and TL2 change the passing phase of the communication frequency signal by 90°. However, there is a need to adjust the line length of each of the transmission lines TL1 and TL2 and the communication frequency amount of the phase change circuit so that the resonance can be shifted to the communication frequency band. In the present embodiment, not only the transmission lines TL1 and TL2 according to Embodiments 1 and 2, but also lumped constants of inductors, capacitors, or the like can be used. Consequently, the layout is facilitated and a reduction in the size of the phase shifter can be achieved. The other components and advantageous effects are similar to those of Embodiments 1 and 2.

Embodiment 4

Figure 11:
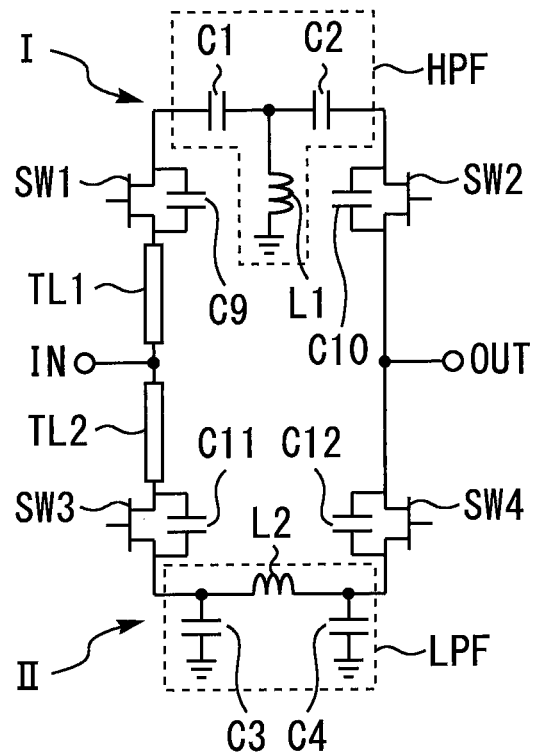
FIG. 11 is a diagram illustrating a phase shifter according to Embodiment 4.

FIG. 11 is a diagram illustrating a phase shifter according to Embodiment 4. Capacitor C9 to C12 are each connected in parallel to the switches SW1 to SW4. Note that the capacitors C9 to C12 may be connected to all the switches SW1 to SW4, or may be connected only to some of transistors.

Because the total capacitance value of the capacitors C9 to C12 connected in parallel to Coff of the switches SW1 to SW4 appears to be a large value, the resonance that occurs due to the appearance of the respective circuits of the high-pass filter HPF and the low-pass filter LPF can be shifted to a low-frequency side. Thus, advantageous effects similar to those of Embodiments 1 to 3 can be obtained, while a reduction in the size of the transmission lines TL1 and TL2 or the phase change circuit according to Embodiments 1 to 3 can be achieved.

Embodiment 5

Figure 12:
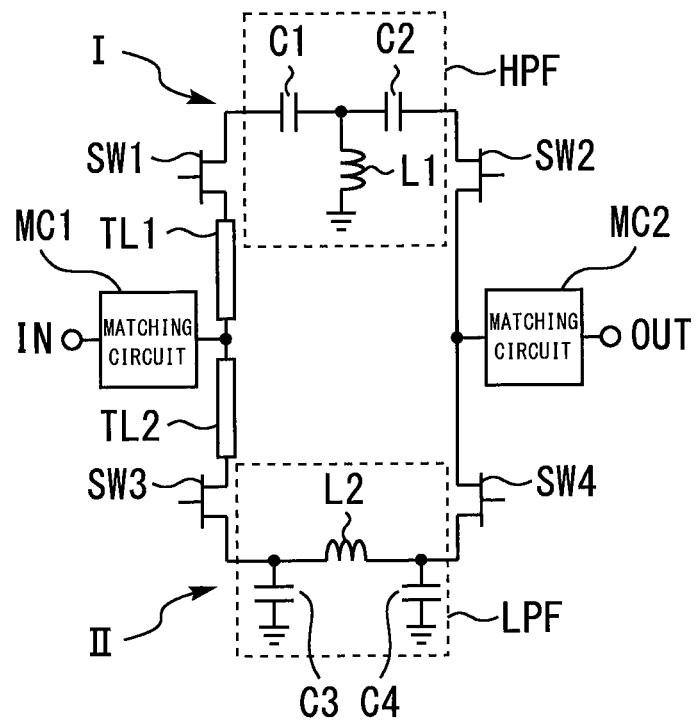
FIG. 12 is a diagram illustrating a phase shifter according to Embodiment 5.

FIG. 12 is a diagram illustrating a phase shifter according to Embodiment 5. Use of an elongated line, a spiral inductor, or the like when the transmission lines TL1 and TL2 are provided may increase the impedance of the phase shifter. Accordingly, the impedance of each of the input terminal IN and the output terminal OUT deviates from a matched impedance of, for example, 50Ω, which may lead to deterioration in reflection characteristics of the phase shifter. Accordingly, in the present embodiment, impedance matching circuits MC1 and MC2 are each connected to the input terminal IN and the output terminal OUT. The impedance matching circuits MC1 and MC2 enable the input terminal IN and the output terminal OUT to be matched to a desired impedance of, for example, 50Ω. As a result, the reflection characteristics of the phase shifter can be improved, which leads to a reduction in power consumption in the phase shifter. The other components and advantageous effects are similar to those of Embodiment 1.

Reference Signs List

I first path; II second path; C5-C8 capacitor (phase change circuit); C9-C12 capacitor; HPF high-pass filter; IN input terminal; LPF low-pass filter; MC1,MC2 impedance matching circuit; OUT output terminal; SW1-SW4 switch; TL1, TL2 transmission line; TL1a-T1d, TL2a-T2d a plurality of lines

The invention claimed is:

1. A phase shifter comprising:
an input terminal;
an output terminal;
first and second paths connected in parallel between the input terminal and the output terminal;
a high-pass filter provided in the first path;
a low-pass filter provided in the second path;
a plurality of switches configured to connect one of the high-pass filter and the low-pass filter to the input terminal and the output terminal and to disconnect the other of the high-pass filter and the low-pass filter; and
a transmission line provided on the first and second paths respectively,
wherein a line length of the transmission line is adjusted such that a resonance caused due to circuit constants of the high-pass filter and the low-pass filter and capacitance obtained when one of the plurality of switches is OFF is shifted to a communication frequency band.

2. The phase shifter according to claim 1, wherein the transmission line includes a plurality of lines, and
a total of line lengths of the plurality of lines is adjusted so as to shift the resonance to the communication frequency band.

3. The phase shifter according to claim 1, further comprising a phase change circuit changing a passing phase and provided on the first and second paths respectively.

4. The phase shifter according to claim 3, wherein the phase change circuit and the transmission line change a passing phase of a communication frequency signal by 90°.

5. The phase shifter according to claim 1, further comprising a capacitor connected in parallel to each of the plurality of switches.

6. The phase shifter according to claim 1, further comprising an impedance matching circuit connected to the input terminal and the output terminal.

7. The phase shifter according to claim 1, wherein a line length of the transmission line is ¼ of a wavelength of a communication frequency.

* * * * *